United States Patent
Ikonen et al.

(10) Patent No.: US 6,970,041 B2
(45) Date of Patent: Nov. 29, 2005

(54) LINEARIZATION METHOD AND AMPLIFIER ARRANGEMENT

(75) Inventors: Riku Ikonen, Salo (FI); Lasse Alestalo, Somero (FI)

(73) Assignee: Elektrobit Oy, Oulu (FI)

( * ) Notice: Subject to any disclaimer, the term of this patent is extended or adjusted under 35 U.S.C. 154(b) by 151 days.

(21) Appl. No.: 10/415,331

(22) PCT Filed: Oct. 30, 2001

(86) PCT No.: PCT/FI01/00947

§ 371 (c)(1),
(2), (4) Date: Apr. 29, 2003

(87) PCT Pub. No.: WO02/37670

PCT Pub. Date: May 10, 2002

(65) Prior Publication Data

US 2004/0012443 A1 Jan. 22, 2004

(30) Foreign Application Priority Data

Oct. 31, 2000 (FI) .............................................. 20002396

(51) Int. Cl.[7] .............................. H03F 1/26; H03F 3/04
(52) U.S. Cl. ...................................... 330/149; 330/296
(58) Field of Search ................................. 330/149, 296

(56) References Cited

U.S. PATENT DOCUMENTS

| | | | |
|---|---|---|---|
| 4,462,004 A | * | 7/1984 | Cox et al. .................... 330/277 |
| 4,591,800 A | * | 5/1986 | Opas ............................ 330/86 |
| 5,136,257 A | | 8/1992 | Reading ...................... 330/129 |
| 5,142,240 A | | 8/1992 | Isota et al. ................... 330/149 |
| 5,420,536 A | | 5/1995 | Faulkner et al. ............. 330/149 |
| 5,426,641 A | * | 6/1995 | Afrashteh et al. ........... 370/347 |
| 5,430,410 A | | 7/1995 | Raynaud et al. ............. 330/279 |
| 5,712,593 A | | 1/1998 | Buer et al. ................... 330/129 |
| 5,936,464 A | | 8/1999 | Grondahl ...................... 330/10 |
| 6,043,707 A | | 3/2000 | Budnik ......................... 330/10 |
| 6,633,750 B1 | * | 10/2003 | Dacus et al. ................. 455/126 |

FOREIGN PATENT DOCUMENTS

| | | |
|---|---|---|
| EP | 0 372 705 A3 | 6/1990 |
| EP | 0 926 815 A | 6/1999 |
| FI | 106413 B | 1/2001 |
| GB | 2 345 212 | 6/2000 |
| WO | WO 00/08750 | 2/2000 |

* cited by examiner

*Primary Examiner*—Patricia Nguyen
(74) *Attorney, Agent, or Firm*—Finnegan, Henderson, Farabow, Garrett, & Dunner, L.L.P.

(57) ABSTRACT

The invention relates to a linearization method and an amplifier arrangement for linearizing an amplifier (50) amplifying an RF signal with a variable envelope. The amplifier arrangement comprises a sampling device (20) for sampling an RF signal to be amplified. The amplifier arrangement further comprises a control device (30) arranged to generate, using samples, an output signal changing its value according to the envelope shape of the RF signal to be amplified. The amplifier arrangement further comprises an adjusting device (40) arranged to adjust, using the output signal, the bias current of the amplifier such that the magnitude of the output signal and the magnitude of the bias current change in the same direction.

17 Claims, 2 Drawing Sheets

LINEARIZATION METHOD AND AMPLIFIER ARRANGEMENT

FIELD OF THE INVENTION

The invention relates to a linearization method for an amplifier amplifying an RF signal with a variable envelope.

BACKGROUND OF THE INVENTION

Amplifier arrangements employ different linearization methods enabling the occurrence of interfering signals, such as distortions, noise and non-linear distortion, to be reduced in an output signal of an amplifier.

U.S. Pat. No. 5,420,536, for example, discloses a non-linear amplifier linearization method based on a feedback circuit in an amplifier.

In FI 9602814, linearization is carried out by predistorting a signal to be coupled to an output stage. The linearization is based on the fact that a device implementing the predistortion and the output stage have inverse operating characteristics compared with each other.

The solution disclosed in U.S. Pat. No. 5,136,257 comprises measuring the output power of an amplifier, which is compared to a predicted value. The solution employs feedback, and information obtained from the feedback is used for adjusting the bias of a multi-stage amplifier. The solution disclosed is relatively complex to implement.

The linearization methods based on feedback are not particularly suitable for use in effective amplifier stages. The linearization methods are not optically suitable for use in amplifiers amplifying high frequency signals either. Furthermore, the known linearization methods are relatively complex to implement.

BRIEF DESCRIPTION OF THE INVENTION

An object of the invention is thus to provide a method and an apparatus implementing the method so as to enable the above-mentioned problems to be alleviated. This is achieved by a method of the type disclosed in the preamble, which is characterized by sampling an RF signal to be amplified in order to generate an output signal changing its value according to the envelope shape of the RF signal to be amplified, and adjusting, using the output signal generated, the bias current of the amplifier such that the output signal and the bias current change in the same direction.

This is also achieved by a method of the type disclosed in the preamble, which is characterized by sampling an RF signal to be amplified in order to generate an output signal changing its value according to the envelope shape of the RF signal to be amplified, generating a signal proportional to an input current of the amplifier, and generating an adjustment signal to adjust the magnitude of the bias current of the amplifier such that the signal proportional to the input current and said output signal are taken into account in the generation process.

The invention also relates to an amplifier arrangement for linearizing an amplifier amplifying an RF signal with a variable envelope.

The arrangement of the invention is characterized in that the amplifier arrangement comprises a sampling device for sampling an RF signal to be amplified, a control device arranged to generate, using samples, an output signal changing its value according to the envelope shape of the RF signal to be amplified, the amplifier arrangement comprising an adjusting device arranged to adjust, using the output signal, the bias current of the amplifier such that the magnitude of the output signal and the magnitude of the bias current change in the same direction.

The arrangement of the invention is further characterized in that the amplifier arrangement comprises a sampling device for sampling an RF signal to be amplified, a control device for generating, using samples, an output signal changing its value according to the envelope shape of the RF signal to be amplified, and the amplifier arrangement being arranged to generate a signal proportional to an input current of the amplifier, and the amplifier arrangement comprising an adjusting device arranged to generate an adjustment signal to adjust the magnitude of the bias current of the amplifier, the adjustment signal being proportional to the input current of the amplifier and said output signal.

Preferred embodiments of the invention are disclosed in the dependent claims.

The invention is based on changing the bias point of an amplifier according to the envelope of a signal to be amplified such that the power consumption of the amplifier is taken into account in the process of changing the bias point.

The method and arrangement of the invention provide several advantages. The arrangement is suitable for linearizing an amplifier amplifying signals with variable envelopes in particular. The linearization method enables more low-power amplifiers to be used, which means that the waste heat produced by the amplifier can be reduced. The method is suitable for use in amplifiers amplifying e.g. OFDM signals, whose levels vary considerably.

The arrangement is suitable both for narrowband and broadband modulated signals. In addition, the arrangement remains stable within a wide temperature range, which reduces the heat produced by the amplifier. The arrangement is simple and cost-effective to implement. The arrangement can thus be readily applied e.g. to systems comprising several amplifiers.

BRIEF DESCRIPTION OF THE DRAWINGS

The invention is now described in closer detail in connection with the preferred embodiments and with reference to the accompanying drawings, in which.

DETAILED DESCRIPTION OF THE INVENTION

Figure 1:
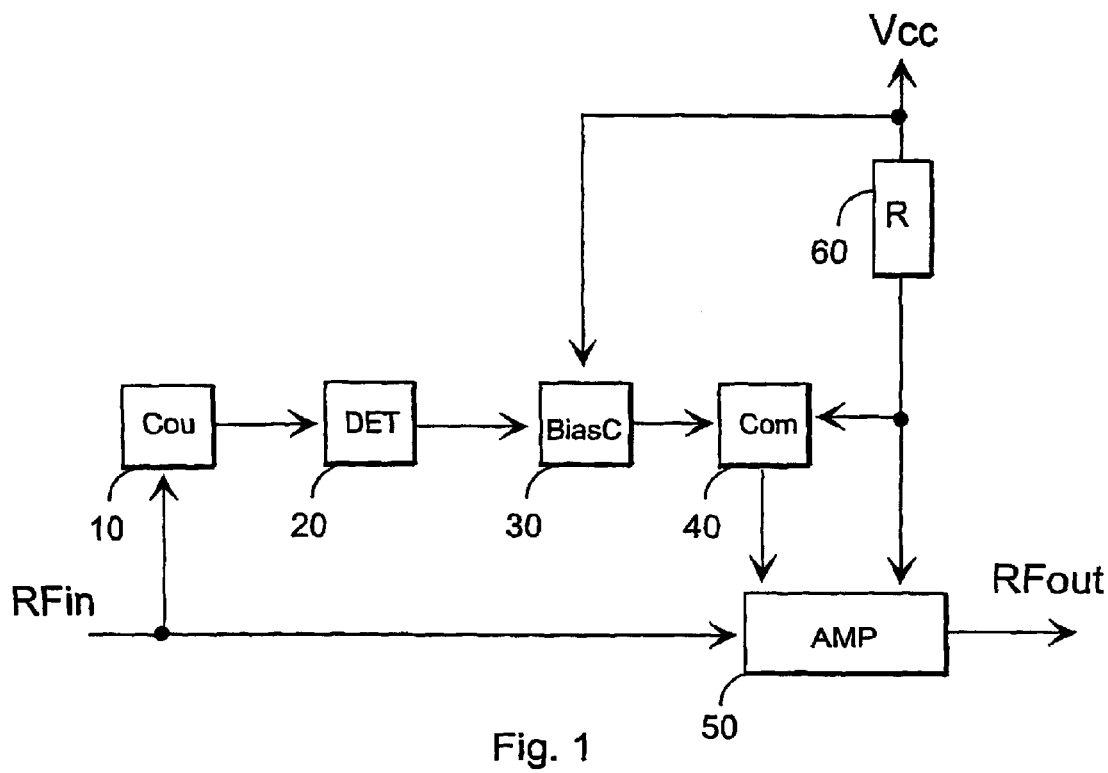
FIG. 1 shows a first embodiment of an amplifier arrangement.

Referring to FIG. 1, an amplifier arrangement comprises a coupling device 10, a sampling device 20, a control device 30, an adjusting device 40, an amplifier 50 and a resistor 60. The amplifier arrangement is arranged to linearize an amplifier for a signal with a variable envelope.

The figure shows that an RF input signal is conveyed to the input of the amplifier 50, the RF input signal being amplified into an RF output signal in the amplifier. The signal applied to the input of the amplifier 50 has a variable envelope. The linearization method is suitable for use in amplifiers amplifying signals having power peaks much greater than an average power. Such signals occur e.g. in RF signals broadband-modulated using e.g. OFDMA or CDMA methods.

In the following, the invention is applied to the amplifier 50 meeting the criteria set for a so-called class A amplifier. Typically, a class A amplifier is extremely linear. The amplifier 50 shown in FIG. 1 can be implemented e.g. using field effect transistors, bipolar junction transistors or e.g. electron tubes. The amplifier may comprise several amplifier stages. The bias point of the amplifier is adjustable, and the amplification of the amplifier remains constant within a normal operating range, or the amplification increases when the bias point is moved higher.

A bias point herein refers to the current an amplifier stage most probably would assume at the prevailing control signal level when no signal to be amplified exists. When the amplifier operates in class A, the bias current is roughly the same irrespective of whether or not the amplifier receives a signal to be amplified.

FIG. 1 shows that the coupling device 10 is coupled to the input of the amplifier 50. The coupling device 10 couples part of the RF input signal to the sampling device 20, which detects the received signal. The operation of the coupling device can be based e.g. on a capacitive, inductive or resistive coupling. The coupling device may be e.g. a directional coupler. The sampling device 20 can be implemented e.g. by a transistor coupling or a diode which rectifies signal samples.

The sampling device is arranged to sample the RF signal coupled to the sampling device by the coupling device 10. The formed samples provide information on the signal coupled to the input of the amplifier 50.

The output of the sampling device 20 is coupled to the control device 30, which, on the basis of the samples, generates an output signal, i.e. a control signal, which changes its value according to the envelope shape of the RF signal. The output of the control device 30 is coupled to the adjusting device 40. The adjusting device 40 can at least partly be implemented e.g. by a transistor, which makes the implementation extremely simple.

FIG. 1 further shows that the amplifier 50 is coupled to an operating voltage Vcc through the resistor 60. Between the resistor 60 and the amplifier 50, the amplifier arrangement is coupled to the adjusting device 40, whose output is coupled to the amplifier 50. In place of the resistor, e.g. a sensor can be used to enable a signal proportional to the bias current to be generated.

In the following, the operation of the amplifier arrangement will be described in closer detail. The samples generated by the sampling device 20 are supplied to the control device 30, which generates an output signal from the samples, the output signal changing its value according to the envelope shape of the RF signal supplied to the input of the amplifier. In the embodiment shown in FIG. 1, the output signal is supplied to the adjusting device 40 adjusting the bias current of the amplifier by an adjustment signal generated by the adjusting device. In another embodiment, the output signal generated by the control device 30 is used for directly adjusting the bias current of the amplifier. The output signal of the control device is thus a voltage or current following the amplitude of the RF signal; this voltage or current will hereinafter be used in generating the adjustment signal controlling the bias current of the stage to be linearized. The higher the level of the RF signal to be amplified, the stronger the bias current the RF signal needs.

Figure 2:
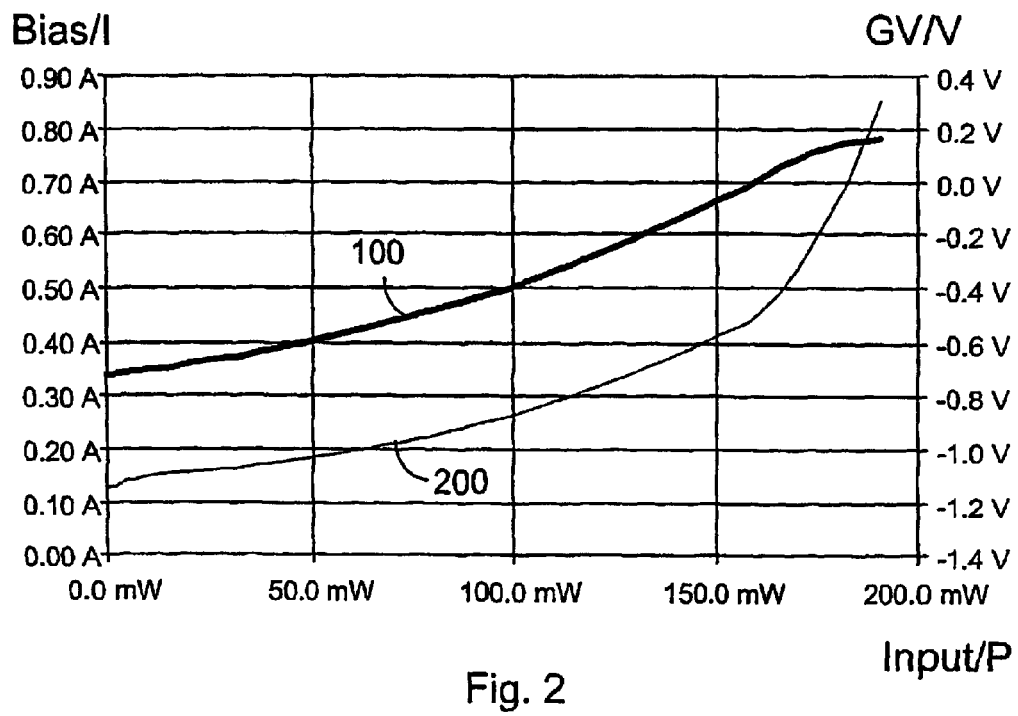
FIG. 2 shows how bias current changes as a function of RF input power.
Figure 3:
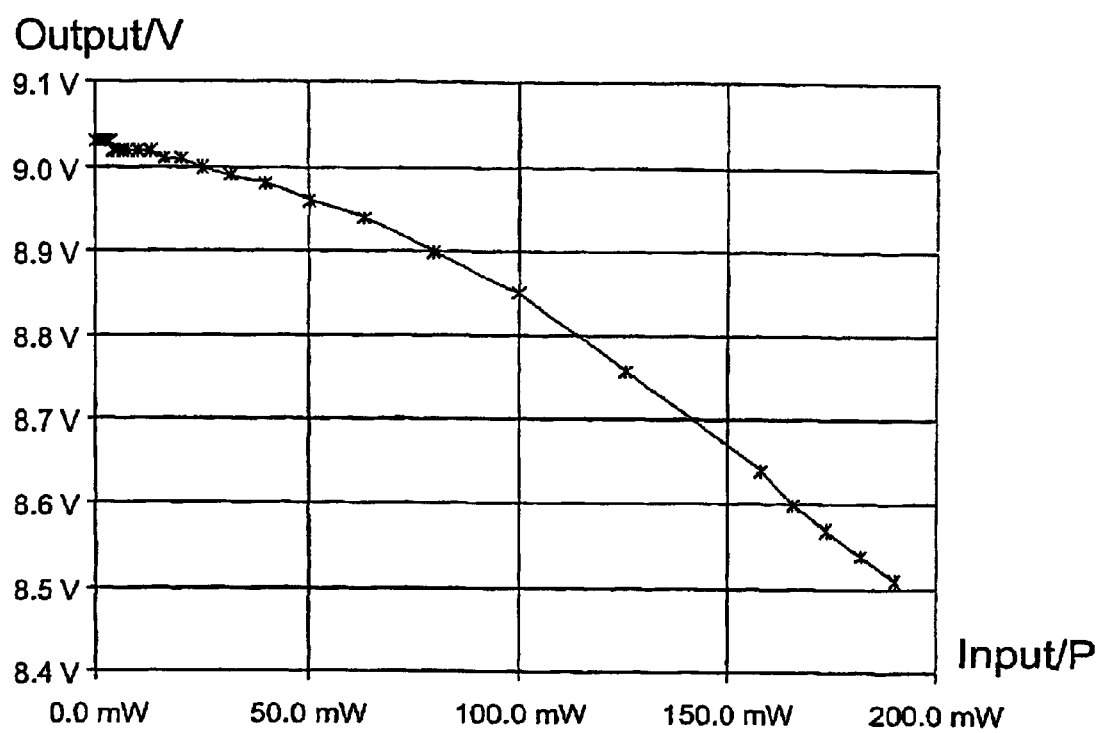
FIG. 3 shows how an output signal of a control device changes as a function of RF input power.

FIG. 2 shows a curve 100 illustrating how the bias current changes as a function of RF input power. FIG. 2 further shows a curve 200 illustrating how a FET gate voltage GV changes as a function of RF input power. FIG. 3 shows a curve illustrating how the output signal of the control device 30 changes as a function of RF input power.

The sampling device 20, which is used in signal detection, is implemented such that it is capable of following the changes in the RF signal levels, i.e. in practice the shape of the envelope of the RF signal, as quickly as possible. This means that the bandwidth of the sampling device is greater than the bandwidth of the modulated RF signal.

It is also possible to amplify a sample signal before the sample signal is detected if the RF signal level is too low to be detected. The signal following the envelope can also be generated from a signal in a digital form. In order to make signal formation akin to the described one easy to implement, a D/A conversion should be carried out in the amplifier and the resulting signal should be used for controlling the bias point of the amplifier.

In practice, the D/A conversion is not necessarily carried out in the amplifier but the conversion is often carried out somewhere else since it is easier for the amplifier to couple one analogue control line than a digital bus.

In OFDMA and WCDMA devices in particular, the signal following the envelope is generated in the digital parts of the device from a signal in a digital form, which is then converted into an analogue signal. If necessary, the analogue signal is mixed to a desired frequency, filtered and amplified in the analogue parts. It would thus be easy for the digital parts to generate a signal proportional to the level of the envelope from the already digital signal and to inform e.g. several amplifier stages about the D/A-converted signal.

If more than two amplifier stages were used, the changes in the delays of the amplifier stages between two amplifier stages would make the timing of the control signal more difficult. In the disclosed method, if necessary, the sample signal can be taken from the output of the amplifier stage e.g. if the sample signal level taken from other points would be too low to enable easy measurement. The delays should be taken into account by using a correction signal, which, however, would then be delayed by a delay caused by the amplifier stage, compared to a situation where no delays occur, so the delay of the amplifier stage has to be short with respect to the rate at which the envelope changes.

In the disclosed method, the bias current is adjusted such that the changes in the output signal affect the magnitude of the bias current. An increase in the output signal thus results in an increase in the bias current. Correspondingly, a decrease in the output signal results in a decrease in the bias current. The output signal and the bias current thus change in the same direction.

Furthermore, the adjusting device 40 receives a signal proportional to an input current of the amplifier. The signal proportional to the input current is generated from the voltage effective over the resistor 60, which is directly proportional to the current consumed by the amplifier.

In principle, linearization could also work without any feedback to provide information on the power consumption of the amplifier 50. In such a case, the output signal of the control device could be used for directly controlling the bias line of the amplifier, which in this case refers to the control line of the amplifier input through which the current signal or voltage signal setting the idle current is conveyed to the amplifier.

In addition to a transistor, the adjusting device 40 can be implemented e.g. by a comparator coupling implemented by means of an operational amplifier, an output signal generated by the control device being supplied to a first input of the comparator coupling and a signal proportional to the input current of the amplifier being supplied to a second input of the comparator coupling. The operational amplifier is used for measuring the power consumption of the amplifier. The operational amplifier compares the power consumption to the signal supplied from an RF-level detector. Using an adjustment signal obtained as a result of the comparison, the bias point of the amplifier stage is controlled such that the bias current is directly dependent on the level of the RF signal supplied to the amplifier.

A minimum level is set for the bias current, however, and the bias current will not be allowed to drop below this minimum level even if the RF input signal amplitude dropped to zero. The bias current minimum level, i.e. a so-called idle bias, is preferably set as low as possible so as to enable as low power consumption as possible. However, the minimum level of the bias current has to be chosen such that the amplification of the amplifier is not reduced too much.

The minimum level of the bias current is set quite low, which means that the amplification of the amplifier is not reduced significantly. Using the detected RF signal, the bias current is increased as soon as the level of the RF signal to be amplified exceeds the signal level corresponding to the minimum bias current. Correspondingly, when the level of the RF input signal to be amplified decreases, the bias current also decreases at the same pace as the RF input signal level.

The amplifier is thus constantly kept in class A, which means that an average bias current, i.e. also the current consumption of the amplifier, is considerably lower when CDMA and OFDMA type signals are amplified, compared to a situation where the amplifier employs a fixed bias. The dynamic adjustment of an operating point further enables distortion in an amplified signal to be reduced.

The amplifier 50 and the adjusting device 40 operating as a comparator combine to form a control loop enabling the voltage and voltage information of the signal obtained from current measurement to be kept as close to constant-ratio as possible compared to the voltage and voltage information of the control signal supplied from the control device. On the other hand, the voltage of the control signal may differ by the threshold voltage of the transistor from the voltage obtained from the current measurement. The difference of the signals received by the adjusting device is thus kept almost constant. The signal obtained from the output of the control loop, in turn, follows the control signal.

As was stated above, the comparison of signals carried out by the adjusting device 40 can be implemented e.g. by a transistor. If the comparison is implemented e.g. by a PNP transistor, an emitter of the transistor is coupled to the amplifier stage and a detected signal is conveyed to a base of the transistor. In the above situation, the detected signal is inverted before being supplied to the base. A collector of the transistor provides the voltage or current to be coupled to the bias line of the amplifier.

In the following, the operation of the adjusting device will be described by means of an example when the adjusting device is implemented by a transistor. Assume that the value of a current measurement resistor is 1 ohm. Hence, 0 . . . 600 mA of bias current corresponds to 0 . . . 600 mV of difference voltage. If the adjustment range of the bias current were 150 mA . . . 600 mA, this would mean that the voltage received by the amplifier would be 150 mV . . . 600 mV below the operating voltage. If it is assumed that the threshold voltage of the transistor used as the comparator is 700 mV, the voltage obtained from the detector has to be between 850 mV . . . 1300 mV below the operating voltage. Since the transistor inverts the detected signal, the output of the sampling device has to be inverted. If the maximum input level of the amplifier is e.g. +20 dBm, the particular adjustment range 150 mA . . . 600 mA could correspond to an input power range of +7 . . . +20 dBm. At input levels lower than the minimum input power level of the input power range, a 150-mA bias current would be used.

If it is assumed that the output voltage of the control device drops e.g. 100 mV, the transistor starts conveying better, which means that the bias current of the amplifier starts to increase. An increase in the bias current results in an increase in the voltage drop of the resistor until the voltage drop has increased 100 mV.

Although the invention has been described above with reference to the example in the accompanying drawings, it is obvious that the invention is not restricted thereto but can be modified in many ways within the inventive idea disclosed in the attached claims.

What is claimed is:

1. A linearization method for an amplifier amplifying an RF signal with a variable envelope, characterized by
   sampling an RF signal to be amplified in order to generate an output signal changing its value according to the envelope shape of the RF signal to be amplified,
   coupling a bias current of the amplifier for adjustment, and
   adjusting the bias current of the amplifier using the output signal generated and the bias current fed back such that the output signal and the bias current change in the same direction.

2. A linearization method for an amplifier amplifying an RF signal with a variable envelope, characterized by
   sampling an RF signal to be amplified in order to generate an output signal changing its value according to the envelope shape of the RF signal to be amplified,
   generating a signal proportional to an input current of the amplifier, and
   generating an adjustment signal to adjust the magnitude of the bias current of the amplifier such that the signal proportional to the input current and said output signal are taken into account in the generation process.

3. A method as claimed in claim 1 or 2, characterized by keeping the bias current at least at a predetermined minimum level irrespective of the output signal level.

4. A method as claimed in claim 1 or 2, characterized by generating an output signal, which changes its current value or voltage value according to the changes in the envelope of the RF input signal.

5. A method as claimed in claim 2, characterized by taking into account a differential signal of said output signal and the signal proportional to the input current in the generation of the adjustment signal.

6. A method as claimed in claim 2, characterized by determining the signal proportional to the input current over a resistor coupled to the operating voltage of the amplifier.

7. A method as claimed in claim 2, characterized by changing the value of the signal proportional to the input current in proportion to the change in said output signal.

8. A method as claimed in claim 2, characterized by keeping the magnitude of the differential signal constantly between predetermined limit values.

9. A method as claimed in claim 2, characterized by keeping the magnitude of the differential signal constant.

10. An amplifier arrangement for linearizing an amplifier (50) amplifying an RF signal with a variable envelope, characterized in that the arrangement comprises a sampling device (20) for sampling an RF signal to be amplified, a control device (30) arranged to generate, using samples, an output signal changing its value according to the envelope shape of the RF signal to be amplified, a coupling to couple a bias current of the amplifier to an adjusting device (40), the adjusting device (40) being arranged to adjust the bias current of the amplifier using the output signal and the bias current fed back such that the magnitude of the output signal and the magnitude of the bias current change in the same direction.

11. An amplifier arrangement for linearizing an amplifier (50) amplifying an RF signal with a variable envelope, characterized in that the arrangement comprises a sampling device (20) for sampling an RF signal to be amplified, a control device (30) for generating, using samples, an output signal changing its value according to the envelope shape of the RF signal to be amplified, and the amplifier arrangement being arranged to generate a signal proportional to an input current of the amplifier, and the amplifier arrangement comprising an adjusting device (40) arranged to generate an adjustment signal to adjust the magnitude of the bias current of the amplifier, the adjustment signal being proportional to the input current of the amplifier and said output signal.

12. An amplifier arrangement as claimed in claim 10 or 11, characterized in that the amplifier arrangement is arranged to keep the bias current at least at a predetermined minimum level irrespective of the level of the output signal.

13. An amplifier arrangement as claimed in claim 10 or 11, characterized in that the control block (30) is arranged to generate an output signal changing its current value or voltage value according to the changes in the envelope of the RF signal.

14. An amplifier arrangement as claimed in claim 11, characterized in that the adjusting device (40) is arranged to generate an adjustment signal from a difference of the signal proportional to the input current and said output signal.

15. An amplifier arrangement as claimed in claim 11, characterized in that the amplifier arrangement comprises a resistor (60), through which the amplifier is coupled to the operating voltage, and the amplifier arrangement is arranged to determine the signal proportional to the input current from the voltage effective over the resistor.

16. An amplifier arrangement as claimed in claim 11, characterized in that the adjusting device (40) is arranged to generate an adjustment signal from the signal proportional to the input current and a differential signal of said output signal, and the adjusting device is arranged to keep the differential signal between predetermined limit values.

17. An amplifier arrangement as claimed in claim 11, characterized in that the adjusting device (40) is arranged to generate an adjustment signal from the signal proportional to the input current and a differential signal of said output signal, and the adjusting device is arranged to keep the differential signal constant.

* * * * *